(12) United States Patent
Tang

(10) Patent No.: US 12,007,812 B2
(45) Date of Patent: Jun. 11, 2024

(54) FLEXIBLE DISPLAY PANEL AND FLEXIBLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jialiang Tang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 538 days.

(21) Appl. No.: 17/280,828

(22) PCT Filed: Dec. 30, 2020

(86) PCT No.: PCT/CN2020/141755
§ 371 (c)(1),
(2) Date: Mar. 26, 2021

(87) PCT Pub. No.: WO2022/141281
PCT Pub. Date: Jul. 7, 2022

(65) Prior Publication Data
US 2023/0157131 A1      May 18, 2023

(30) Foreign Application Priority Data
Dec. 29, 2020   (CN) .......................... 202011590572.1

(51) Int. Cl.
G06F 1/16      (2006.01)
H04M 1/02      (2006.01)
(Continued)

(52) U.S. Cl.
CPC ........ G06F 1/1652 (2013.01); H04M 1/0268 (2013.01); *H10K 59/80* (2023.02); *H10K 77/111* (2023.02); *H10K 2102/311* (2023.02)

(58) Field of Classification Search
CPC ... G06F 1/1652; G06F 1/1601; H04M 1/0268
See application file for complete search history.

(56) References Cited

U.S. PATENT DOCUMENTS

2021/0149448 A1* 5/2021 Cao ..................... G06F 1/1652
2021/0165454 A1* 6/2021 Dong .................... G06F 1/1652
(Continued)

FOREIGN PATENT DOCUMENTS

CN    109801562 A    5/2019
CN    110148620 A    8/2019
(Continued)

Primary Examiner — Nidhi Thaker
(74) Attorney, Agent, or Firm — PV IP PC; Wei Te Chung; Zhigang Ma

(57) ABSTRACT

A flexible display panel and a flexible display device are provided. The flexible display panel includes a flexible display screen and a support provided on a backside of the flexible display screen. The flexible display screen includes a first bending region and a second bending region disposed on two opposite sides of the first bending region, and the second bending region is positioned at an edge of the flexible display. The support includes a first folding portion corresponding to the first bending region and a hollowed-out structure corresponding to the second bending region.

9 Claims, 5 Drawing Sheets

(51) Int. Cl.
  *H10K 59/80* (2023.01)
  *H10K 77/10* (2023.01)
  *H10K 102/00* (2023.01)

(56) References Cited

U.S. PATENT DOCUMENTS

| | | | | |
|---|---|---|---|---|
| 2022/0147107 | A1* | 5/2022 | Wang | G06F 1/1616 |
| 2022/0238821 | A1* | 7/2022 | Cho | H10K 77/111 |
| 2022/0320464 | A1* | 10/2022 | Wang | H10K 50/844 |
| 2023/0094074 | A1* | 3/2023 | Song | G09F 9/301 |
| | | | | 361/679.01 |
| 2023/0185340 | A1* | 6/2023 | Yun | G06F 1/1652 |
| | | | | 361/679.27 |
| 2023/0409086 | A1* | 12/2023 | Lin | G06F 1/1652 |

FOREIGN PATENT DOCUMENTS

| | | | | |
|---|---|---|---|---|
| CN | 110792905 A | | 2/2020 | |
| CN | 111462632 A | | 7/2020 | |
| CN | 111497411 A | | 8/2020 | |
| CN | 111510527 A | * | 8/2020 | ......... H04M 1/0249 |
| CN | 111510527 A | | 8/2020 | |
| CN | 111785177 A | * | 10/2020 | |
| CN | 111785177 A | | 10/2020 | |
| CN | 111816070 A | | 10/2020 | |
| CN | 111816074 A | * | 10/2020 | ............ G09F 9/301 |
| CN | 111986571 A | | 11/2020 | |
| CN | 112133202 A | | 12/2020 | |
| CN | 113066362 A | * | 7/2021 | ............ G09F 9/301 |
| CN | 113658516 A | * | 11/2021 | |
| CN | 114038324 A | * | 2/2022 | |
| CN | 115132086 A | * | 9/2022 | |
| CN | 217955365 U | * | 12/2022 | ............ G06F 1/1616 |
| CN | 219046225 U | * | 5/2023 | ............ G06F 1/1641 |
| JP | 2005338497 A | | 12/2005 | |
| KR | 20190043349 A | * | 4/2019 | |
| WO | WO-2023005342 A1 | * | 2/2023 | ............... G09F 9/30 |
| WO | WO-2023184607 A1 | * | 10/2023 | |
| WO | WO-2023191522 A1 | * | 10/2023 | ............... G06F 1/16 |

* cited by examiner

FLEXIBLE DISPLAY PANEL AND FLEXIBLE DISPLAY DEVICE

RELATED APPLICATIONS

This application is a Notional Phase of PCT Patent Application No. PCT/CN2020/141755 having international filing date of Dec. 30, 2020, which claims the benefit of priority of Chinese Patent Application Nos. 202011590572.1 filed on Dec. 29, 2020. The contents of the above applications are all incorporated by reference as if fully set forth herein in their entirety.

FIELD OF INVENTION

The present application relates to the field of display technologies, and in particular to a flexible display panel and a flexible display device.

BACKGROUND OF INVENTION

Development trend of intelligence, portability, and flexibility is one of the main development directions of current electronic equipment. New display devices represented by organic light-emitting diodes (OLEDs) have received more and more attention and recognition due to their outstanding features such as lightweightness and thinness, vividness, energy-saving, and flexibility. Among them, foldable displays, as a development direction of a new generation of flexible display technology, have received extensive attention in the industry.

However, in order to facilitate consumers to have a better handfeel when holding a display device or sliding a screen, current high-end products are designed with curved surfaces, and a shape of a current foldable flexible display device is relatively square and monotonous. Consumers have a less satisfactory handfeel when holding the flexible display device or sliding the screen, and how to realize the curved surface design of the foldable flexible display device has become an urgent problem in this field.

SUMMARY OF INVENTION

Technical Problem

At present, the shape of the foldable flexible display device is relatively square and monotonous, and it is difficult to realize the curved surface design of the foldable flexible display device.

Technical Solutions

In a first aspect, the present application provides a flexible display panel, the flexible display panel including:
  a flexible display screen including a first bending region and a second bending region positioned on two opposite sides of the first bending region, wherein the second bending region is positioned at an edge of the flexible display screen; and
  a support disposed on a backside of the flexible display screen and connected to the flexible display screen, wherein the support includes a first folding portion corresponding to the first bending region and a hollowed-out structure corresponding to the second bending region.

In some embodiments, a first grid-structure is provided at the first folding portion.

In some embodiments, the hollowed-out structure includes a second folding portion corresponding to the second bending region and a second grid-structure provided at the second folding portion, and the second folding portion is positioned at an edge of the support.

In some embodiments, the second grid-structure extends to an edge of the second folding portion in a direction away from the first folding portion.

In some embodiments, a distance between the edge of the second folding portion away from the first folding portion and the second grid-structure is greater than zero.

In some embodiments, a grid density of the second grid-structure is less than a grid density of the first grid-structure.

In some embodiments, the support includes a first surface close to the flexible display screen and a second surface away from the flexible display screen, and a first grid-hole of the first grid-structure and a second grid-hole of the second grid-structure both connect the first surface to the second surface.

In some embodiments, the first grid-hole and the second grid-hole are filled with a buffer material.

In some embodiments, a bending axis of the first bending region is parallel to a bending axis of the second bending region.

In a second aspect, the present application further provides a flexible display device, the flexible display device including a middle frame module and a flexible display panel, wherein the flexible display panel includes:
  a flexible display screen including a first bending region and a second bending region positioned on two opposite sides of the first bending region, wherein the second bending region is positioned at an edge of the flexible display screen; and
  a support disposed on a backside of the flexible display screen and connected to the flexible display screen, wherein the support includes a first folding portion corresponding to the first bending region and a hollowed-out structure corresponding to the second bending region.

In some embodiments, a first grid-structure is provided at the first folding portion.

In some embodiments, the hollowed-out structure includes a second folding portion corresponding to the second bending region and a second grid-structure provided at the second folding portion, and the second folding portion is positioned at an edge of the support.

In some embodiments, the second grid-structure extends to an edge of the second folding portion in a direction away from the first folding portion.

In some embodiments, a distance between the edge of the second folding portion away from the first folding portion and the second grid-structure is greater than zero.

In some embodiments, a grid density of the second grid-structure is less than a grid density of the first grid-structure.

In some embodiments, the support includes a first surface close to the flexible display screen and a second surface away from the flexible display screen, and a first grid-hole of the first grid-structure and a second grid-hole of the second grid-structure both connect the first surface to the second surface.

In some embodiments, the first grid-hole and the second grid-hole are filled with a buffer material.

In some embodiments, a bending axis of the first bending region is parallel to a bending axis of the second bending region.

Wherein, the middle frame module is positioned on a backside of the flexible display panel and is connected to the flexible display panel, the middle frame module includes a folding region corresponding to the first bending region, a portion of the flexible display screen positioned in the second bending region is bent to the backside of the flexible display screen to form a first curved portion, and the middle frame module further includes a second curved portion corresponding to the first curved portion.

Beneficial Effect

The first bending region of the flexible display screen can be bent, and an edge portion of the flexible display screen can also be bent. At the same time, the support is configured to support the flexible display screen, and the support has the hollowed-out structure positioned corresponding to the second bending region, so that while the flexible display panel has a folding function, a curved structure with a specific curvature can be formed at the edge of the flexible display panel. Therefore, the flexible display screen can be used to form a foldable flexible display device with a curved surface. When the consumer holds the flexible display device, a palm of a hand touches the curved surface of the edge of the flexible display screen, which can improve a handfeel of consumers, and at the same time facilitate consumers to slide and operate the flexible display screen.

BRIEF DESCRIPTION OF FIGURES

The following detailed description of the specific embodiments of the present application in conjunction with the accompanying drawings will make the technical solutions and other beneficial effects of the present application obvious.

Figure 1:
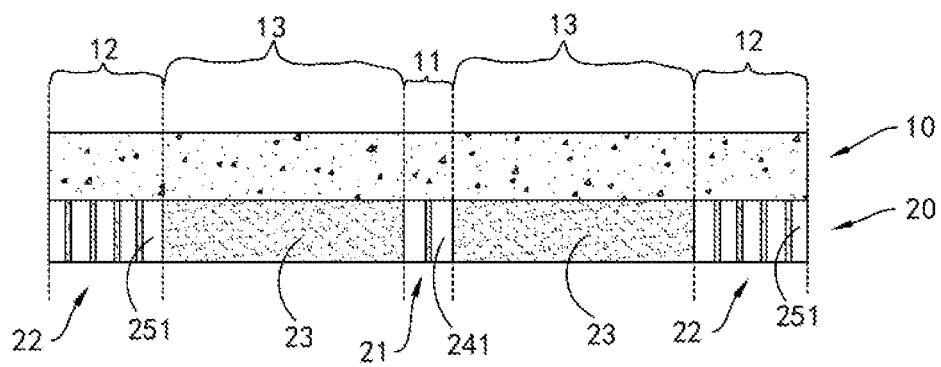
FIG. 1 is a schematic structural diagram of a flexible display panel according to a first embodiment of the present application.

REFERENCE SIGNS 10, flexible display screen; 11, first bending region; 12, second bending region; 13, non-bending region; 14, flexible substrate; 15, flexible screen; 16, flexible polarizer; 17, flexible encapsulation cover plate; 18, first curved portion; 20, support; 21, first folding portion; 22, second folding portion; 23, non-folding portion; 24, first grid-structure; 241, first grid-hole; 25, second grid-structure; 251, second grid-hole; 30, buffer layer; 40, optical adhesive layer; 50, light-shielding layer; 60, middle frame module; 61, folding region; 62, second curved portion; 63, first portion; 64, second portion; and 65, hinge.

DETAILED DESCRIPTION OF EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present application addresses a technical problem that a shape of current flexible display devices is relatively square and monotonous, and consumers have a less satisfactory handfeel when holding the flexible display devices.

First Embodiment

The present application provides a flexible display panel, as shown in FIG. 1, wherein the flexible display panel includes a flexible display screen 10 and a support 20. The support 20 is disposed on a backside of the flexible display screen 10 and is connected to the flexible display screen 10, and is configured to support the flexible display screen 10 to prevent the flexible display screen 10 from sinking or deforming during a process of operating the flexible display panel.

Wherein, the flexible display panel is a foldable flexible display panel, the flexible display screen 10 can be a flexible organic light-emitting diode (OLED) display screen; preparation material of the support 20 can be a material with greater strength, plasticity, and strong bending resistance, including but not limited to metal materials such as steel, copper, iron, aluminum, copper alloy, iron alloy, and aluminum alloy, and acrylic or poly non-metallic materials such as carbonate.

Specifically, the flexible display screen 10 includes a first bending region 11, and the support 20 includes a first folding portion 21 corresponding to the first bending region 11.

It can be understood that the first bending region 11 defines the flexible display screen 10 into two portions positioned on both sides of the first bending region 11. When the flexible display panel is folded, the flexible display screen 10 is folded along the first bending region 11, at the same time, the support 20 is synchronously folded with the flexible display screen 10 along the first folding portion 21, and the support 20 supports the flexible display screen 10 during a folding process of the flexible display screen 10.

Specifically, the flexible display screen 10 can be attached to the support 20, and the first bending region 11 can be positioned in a middle region of the flexible display screen 10.

Wherein, the first folding portion 21 and the flexible display screen 10 can be fixedly connected by a hinge or the like. The first folding portion 21 and the flexible display screen 10 can also be separated, that is, a portion of the flexible display screen 10 positioned at the first bending region 11 is detachably disposed on the first folding portion 21.

Specifically, the flexible display screen 10 further includes a non-bending region 13 positioned on both sides of the first bending region 11, and the support 20 further includes a non-folding portion 23 corresponding to the non-bending region 13. The portion of the flexible display screen 10 positioned in the non-bending region 13 and the non-folding portion 23 can be fixedly connected by the hinge or the like.

It can be understood that the non-folding portion 23 of the support 20 cannot be bent, and the non-folding portion 23 is configured to support the portion of the flexible display screen 10 positioned in the non-bending region 13. Therefore, the portion of the flexible display screen 10 positioned in the non-bending region 13 cannot be bent, so as to prevent the portion of the flexible display screen 10 positioned in the non-bending region 13 from being folded or deformed during the folding process of the flexible display screen 10.

Figure 2:
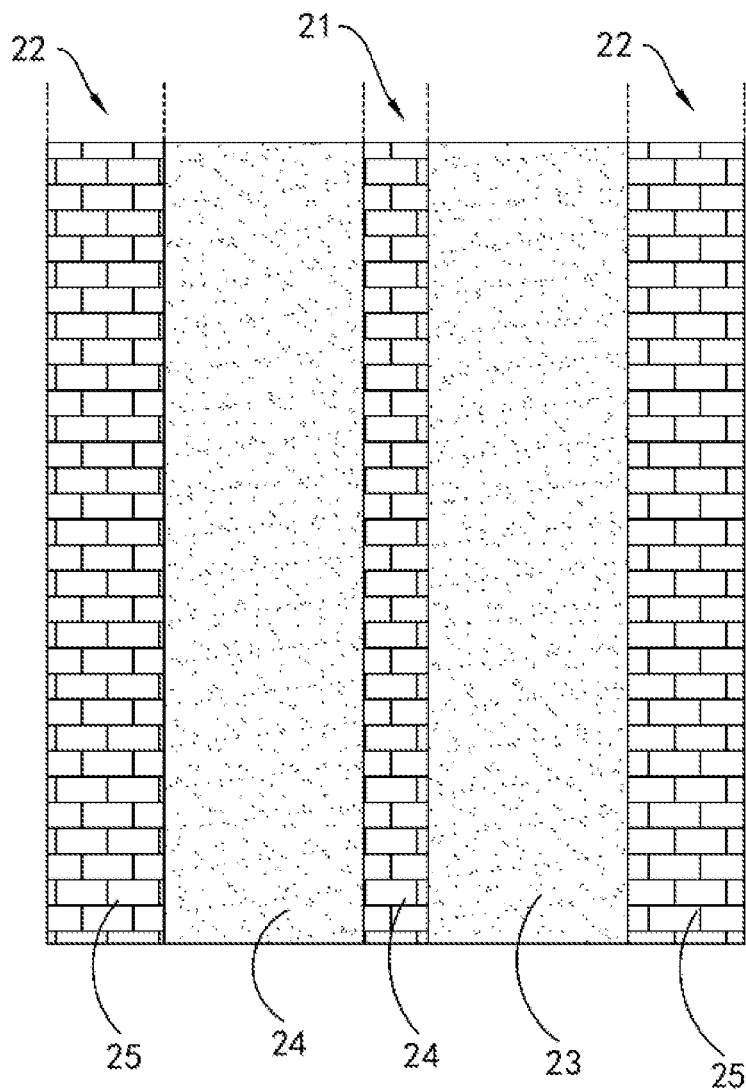
FIG. 2 is a schematic structural diagram of a support according to the first embodiment of the present application.

As shown in FIG. 1 and FIG. 2, a first grid-structure 24 can be provided at the first folding portion 21, and the first grid-structure 24 can be formed on the first folding portion 21 by means of laser etching or chemical etching. The first grid-structure 24 is configured to improve the stretching and elongation properties of the first folding portion 21, thereby greatly enhancing a bending performance of the first folding portion 21.

Specifically, the flexible display screen 10 further includes a second bending region 12 positioned on two opposite sides of the first bending region 11, and the second bending region 12 is positioned at an edge of the flexible display screen 10, that is, the second bending region 12 is an edge region of the flexible display screen 10. The support 20 further includes a hollowed-out structure corresponding to the second bending region 12.

It can be understood that the non-bending region 13 of the flexible display screen 10 is a portion of the flexible display screen 10 excluding the first bending region 11 and the second bending region 12.

It should be noted that the first bending region 11 of the flexible display screen 10 in the present application can be bent, and a portion of the flexible display screen positioned in the second bending region 12 can also be bent. At the same time, the support is configured to support the flexible display screen 10, and the support 20 has the hollowed-out structure positioned corresponding to the second bending region 12, so that while the flexible display panel has a folding function, a curved structure with a specific curvature can be formed at the edge of the flexible display panel. Therefore, the flexible display screen can be used to form a foldable flexible display device with a curved surface. When the consumer holds the flexible display device, a palm of a hand touches the curved surface of the edge of the flexible display screen, which can improve a handfeel of consumers, and at the same time facilitate consumers to slide and operate the flexible display screen.

In an embodiment, the hollowed-out structure includes a second folding portion 22 corresponding to the second bending region 12 and a second grid-structure 25 disposed on the second folding portion 22. The second folding portion 22 is positioned at an edge of the support 20, that is, the second folding portion 22 is an edge portion of the support 20.

Wherein, the second folding portion 22 and the flexible display screen 10 can be fixedly connected by a hinge or the like, and the second folding portion 22 can also be separated from the flexible display screen 10, that is, the portion of the flexible display screen 10 positioned in the second bending region 12 is detachably disposed on the second folding portion 22.

Wherein, the first folding portion 21, the second folding portion 22, and the non-folding portion 23 can be integrally formed. The first folding portion 21, the second folding portion 22, and the non-folding portion 23 can also be separately formed and then assembled by threaded connection, hinge, or snap connection to form the support 20. The second grid-structure 25 can be formed on the second folding portion 22 by means of laser etching or chemical etching.

It should be noted that the hollowed-out structure is a partially hollowed-out structure, when the portion of the flexible display screen 10 positioned in the second bending region is bent to form an edge curved surface, the second folding portion 22 can also be bent to form an arc structure that supports the edge curved surface of the flexible display screen 10. At the same time, the second grid-structure 25 is configured to improve the stretching and elongation properties of the second folding portion 22, thereby greatly enhancing a bending performance of the second folding portion 22.

It should be noted that the second grid-structure 25 and the first grid-structure 24 can be formed at the same time in a process, or can be formed through different processes.

In an embodiment, a grid density of the second grid-structure 25 is less than a grid density of the first grid-structure 24.

It is understandable that the grid density refers to number of grids in a unit region. The greater the grid density, the greater the number of grids in the unit region and the smaller the grid size.

After the flexible display panel is assembled to form a flexible display device, during a use of the flexible display panel, the first folding portion 21 will be folded multiple times. By increasing the grid density of the first grid-structure 24, therefore, while the first grid-structure 24 is configured to enhance the bending performance of the first folding portion 21, the strength of the first folding portion 21 is ensured, and the first folding portion 21 is prevented from bend-breaking.

After the flexible display panel is assembled to form a flexible display device, the second folding portion 22 is bent to form the arc structure and then remains in the arc structure. There is no need to bend the second folding portion 22. At this time, by reducing the grid density of the first grid-structure 24, the bending performance of the second folding portion 22 can be greatly improved, facilitating a formation of the arc structure with a preset size, and improving a processing accuracy.

It should be noted that the grid density of the first grid-structure 24 and the second grid-structure 25 can be selected according to the actual conditions of material, area, and thickness of the support 20.

Specifically, the support 20 includes a first surface close to the flexible display screen 10 and a second surface away from the flexible display screen 10. A first grid-hole 241 of the first grid-structure 24 and a second grid-hole 251 of the second grid-structure 25 both connect the first surface to the second surface to improve the bending performance of the first folding portion 21 and the second folding portion 22.

It is understandable that a cross-sectional shape of the first grid-structure and the second grid-structure can be regular or irregular, including but not limited to bar, rhomboidal, hexagonal, circular, square, elliptical, or arc, etc., and the present application is not limited.

In an embodiment, the second grid-structure 25 extends to the edge of the second folding portion 22 in a direction away from the first folding portion 21.

It is understandable that the second folding portion 22 is positioned at the edge of the support 20, and the edge of the second folding portion 22 is the edge of the support 20, so that the bending performance of the edge of the second folding portion 22 can be facilitated. The second folding portion 22 is bent to form an arc structure with a predetermined size.

In an embodiment, a bending axis of the first bending region 11 is parallel to a bending axis of the second bending region 12.

It can be understood that when the flexible display screen 10 is folded, two portions of the flexible display screen 10 positioned on both sides of the first bending region 11 rotate around the bending axis of the first bending region 11, and the bending axis of the second bending region 12 refers to an axial direction of a curved structure when the second bending region 12 forms the curved structure.

Wherein, the bending axis of the first bending region 11 is parallel to a bending axis of the first folding portion 21, and the bending axis of the second bending region 12 is parallel to a bending axis of the second folding portion 22.

In an embodiment, a width of the second grid-structure 25 is greater than a width of the first grid-structure 24.

It should be noted that FIG. 1 and FIG. 2 only illustrate the case where each of two sides of the flexible display panel can form a curved structure. It is understandable that the flexible display panel can also be configured such that all four sides can form a curved structure. That is, each the second bending region 12 is provided at edges of the four sides of the flexible display panel.

It is understandable that the above description only describes an arrangement and connection of the flexible display screen 10 and the support 20, and the flexible display screen 10 is generally formed by a combination of a multilayer film structure.

Figure 3:
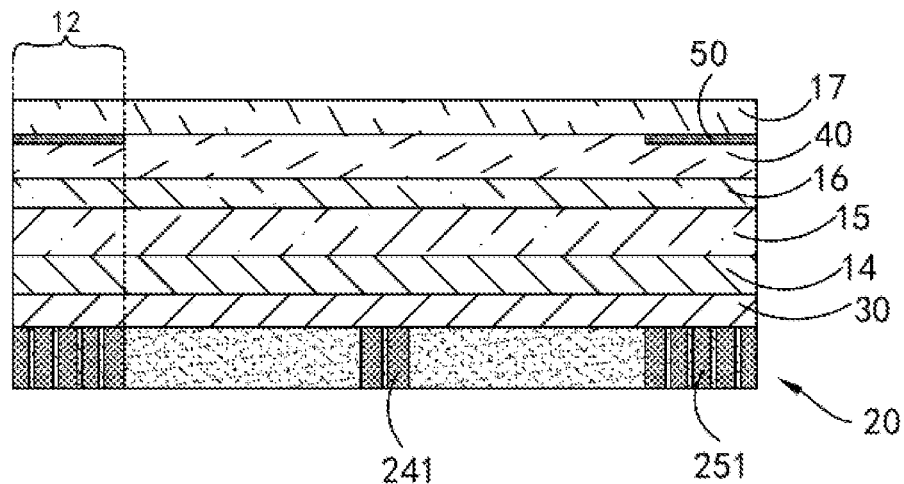
FIG. 3 is another schematic structural diagram of the flexible display panel according to the first embodiment of the present application.

As shown in FIG. 3, in an embodiment, the flexible display screen 10 includes a flexible substrate 14, a flexible screen body 15 disposed on the flexible substrate 14, a flexible polarizer 16 disposed on the flexible screen body 15, and a flexible encapsulation cover plate 17 disposed on the flexible polarizer 16.

Wherein, the support 20 is positioned on a side of the flexible substrate 14 away from the flexible screen body 15. The flexible substrate 14 is connected to the support 20 through a buffer layer 30. The flexible encapsulation cover plate 17 is bonded to the flexible polarizer 16 through an optical adhesive layer 40. The flexible encapsulation cover plate 17 includes, but is not limited to, a transparent glass cover plate or a transparent plastic cover plate.

In an embodiment, the flexible encapsulation cover plate 17 is further provided with a light-shielding layer 50 on a side close to the optical adhesive layer 40, and the light-shielding layer 50 is positioned in the second bending region 12 to prevent an edge from light leakage. The light-shielding layer 50 can be a black ink layer.

In an embodiment, the first grid-hole 241 and the second grid-hole 251 are filled with a buffer material, and the buffer material includes, but is not limited to, an elastic material or a foamed porous material to enhance the strength of the first folding portion 21 and the second folding portion 22, and prevent the first folding portion 21 and the second folding portion 22 from bend-breaking.

It should be noted that it is also possible to fill only the first grid-hole 241 or the second grid-hole 251 with the buffer material.

Second Embodiment

The present application further provides a flexible display panel, which differs from the first embodiment only in an arrangement of the second grid-structure 25.

Figure 4:
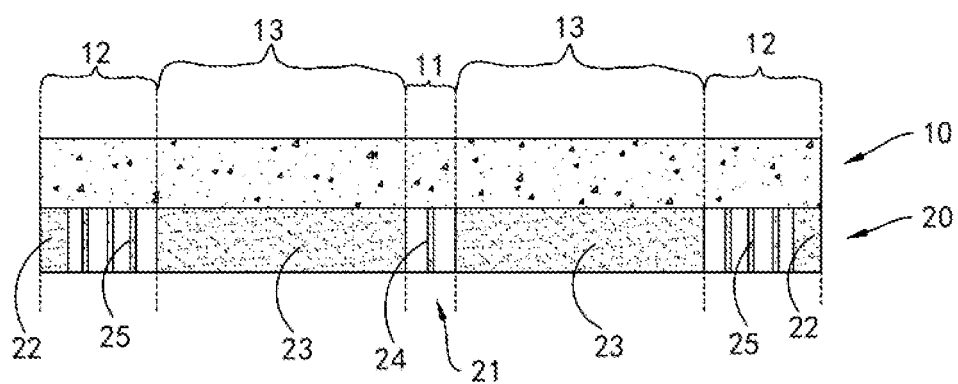
FIG. 4 is a schematic structural diagram of a flexible display panel according to a second embodiment of the present application.
Figure 5:
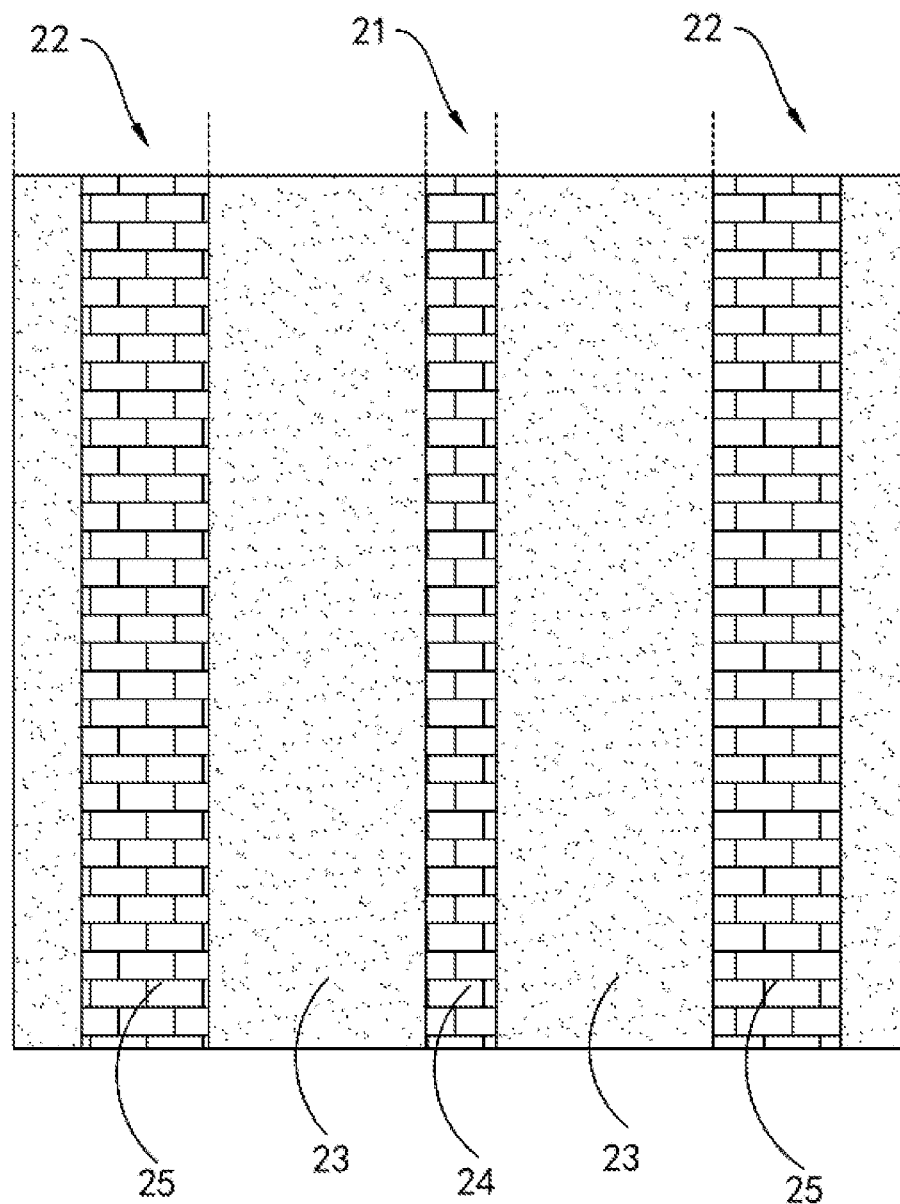
FIG. 5 is a schematic structural diagram of the support according to the second embodiment of the present application.

Specifically, as shown in FIG. 4 and FIG. 5, a distance between the edge of the second folding portion 22 away from the first folding portion 21 and the second grid-structure 25 is greater than zero, that is, an orthographic projection of the edge of the second folding portion 22 away from the first folding portion 21 projected on the flexible display screen 10 and an orthographic projection of the second grid-structure 25 projected on the flexible display screen 10 have no overlap.

It is understandable that an edge portion of the second folding portion 22 away from the first folding portion 21 does not have a grid-structure, so that the strength and rigidity of the edge portion of the second folding portion 22 away from the first folding portion 21 can be ensured, and the edge portion of the second folding portion 22 away from the first folding portion 21 is prevented from sinking or deforming during operating.

It should be noted that a size of the distance between the edge of the second folding portion 22 away from the first folding portion 21 and the second grid-structure 25 can be selected according to actual conditions.

Third Embodiment

The present application further provides a flexible display panel, which differs from the first embodiment only in the structure of a hollowed-out structure.

Figure 6:
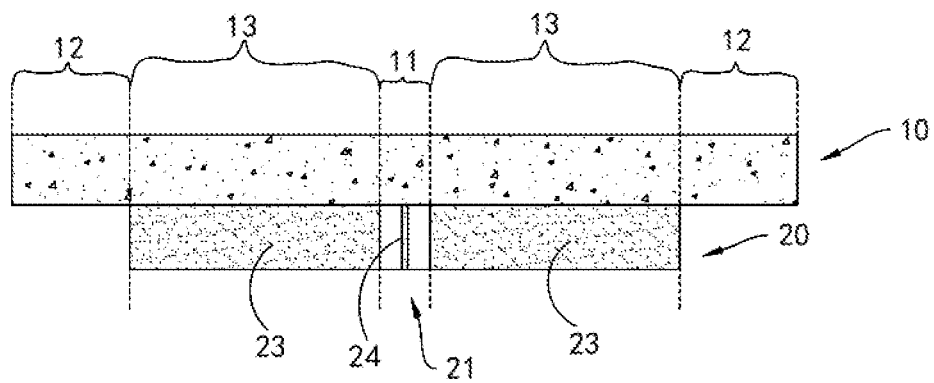
FIG. 6 is a schematic structural diagram of a flexible display panel according to a third embodiment of the present application.

Specifically, as shown in FIG. 6, an orthographic projection of a support 20 projected on a flexible display screen 10 is in contact with or separated from a first bending region 11, that is, a distance between the orthographic projection of the support 20 projected on the flexible display screen 10 and the first bending region 11 is greater than or equal to zero, that is, the hollowed-out structure is a complete hollowed-out structure, that is, a portion of the support 20 corresponding to a second bending region 12 is completely hollow in the present embodiment.

It can be understood that the portion of the support 20 corresponding to the second bending region 12 is removed, so as to facilitate a bending of a portion of the flexible display screen 10 positioned in the second bending region 12.

Figure 7:
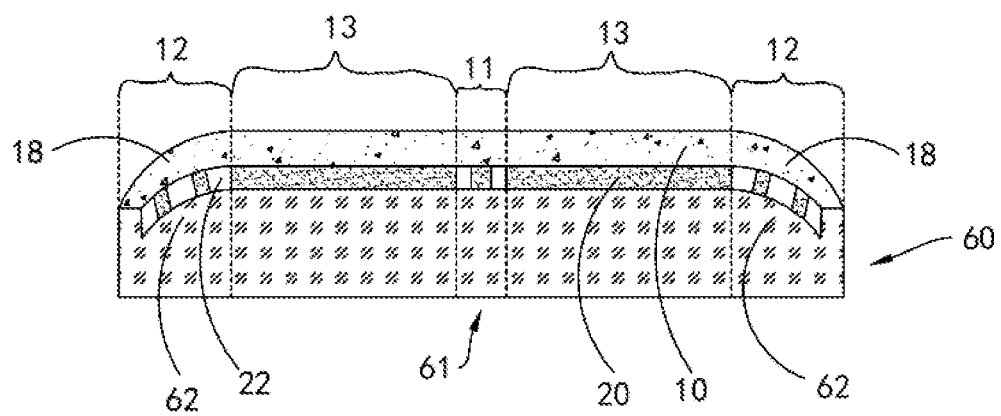
FIG. 7 is a schematic structural diagram of a flexible display device according to an embodiment of the present application.

Based on the above-mentioned flexible display panel, the present application further provides a flexible display device. As shown in FIG. 7, the flexible display device includes a middle frame module 60 and a flexible display panel as described in any of the above-mentioned embodiments.

Wherein, the middle frame module 60 is positioned on a backside of the flexible display panel and is connected to the flexible display panel, and the middle frame module 60 includes a folding region 61 corresponding to a first bending region 11. A portion of the flexible display screen 10 positioned in the second bending region 12 is bent back to form a first curved portion 18. The middle frame module 60 further includes a second curved portion 62 corresponding to the first curved portion 18.

It should be noted that the middle frame module 60 is configured to support and fix the flexible display panel, and the flexible display panel and the middle frame module 60 can be fixedly connected by a sealant. The middle frame module 60 can include a middle frame and a back shell, and the flexible display device can be a display device such as a mobile phone, a computer display screen, a tablet computer, or a handheld game console. Surfaces of the first curved portion 18 and the second curved portion 62 are both curved, and the surface of the second curved portion 62 matches a bottom surface of the first curved portion 18.

Refer to FIG. 7, it can be understood that when the support 20 includes a second folding portion 22, the second folding portion 22 is bent to a backside to form an arc structure that matches the first curved portion 18, and the arc structure fits on the second curved portion 62.

Figure 8:
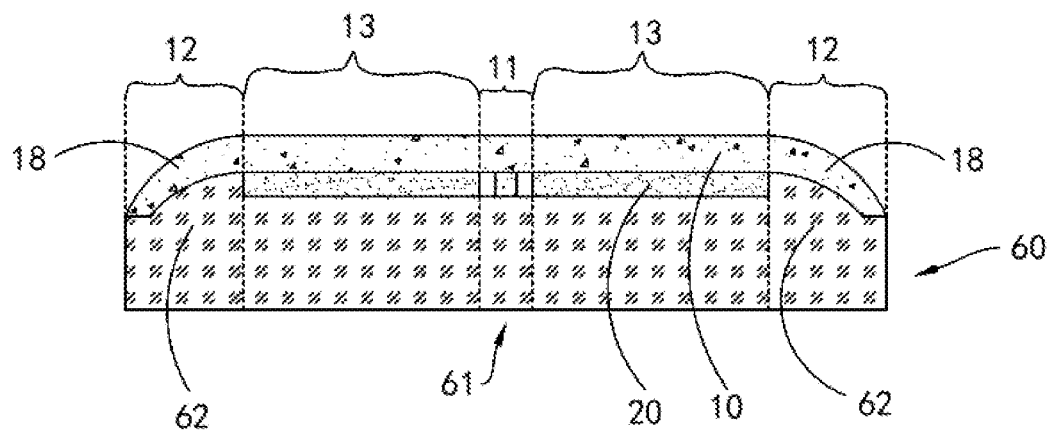
FIG. 8 is another schematic structural diagram of the flexible display device according to an embodiment of the present application.

Refer to FIG. 8, it can be understood that when the support 20 does not include the second folding portion 22, the first curved portion 18 of the flexible display panel is attached to the second curved portion 62, and the second curved portion 62 of the middle frame module 60 is configured to support the first curved portion 18.

As shown in FIG. 7 and FIG. 8, in an embodiment, a groove is defined on the middle frame module 60, and the support 20 is disposed in the groove to reduce an overall thickness of the flexible display device and to make an overall structure of the flexible display device more compact.

It is understandable that the middle frame module 60 can be folded along a folding region 61, and the middle frame module 60 can be folded along the folding region 61 in various ways.

Figure 9:
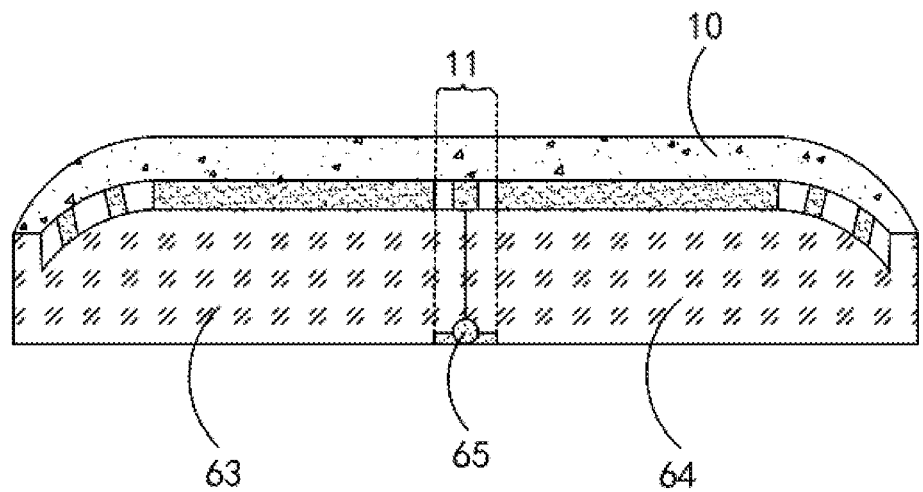
FIG. 9 is yet another schematic structural diagram of the flexible display device according to an embodiment of the present application.

In an embodiment, as shown in FIG. 9, a hinge 65 is disposed in the folding region 61 of the middle frame module 60, and a hinge axis of the hinge 65 is in parallel with a bending axis of the first bending region 11.

Wherein, the middle frame module 60 includes a first portion 63 and a second portion 64. The first portion 63 is fixedly connected to a side wing of the hinge 65, and the second portion 64 is fixedly connected to another side wing of the hinge 65, so that the first portion 63 and the second portion 64 can rotate around the hinge axis of the hinge 65, therefore the middle frame module 60 can be folded along the folding region 61.

It should be noted that the folding region 61 of the middle frame module 60 can also be made of a flexible material, and other portion of the middle frame module 60 is connected to the folding region 61, so that the middle frame module 60 can be folded along the folding region 61, therefore the middle frame module 60 can be folded along the folding region 61.

It can be understood that, in actual implementation, the middle frame module 60 can also be folded along the folding region 61 in other ways, which will not be listed here.

The beneficial effects of the present application are that the first bending region 11 of the flexible display screen 10 can be bent, the edge portion of the flexible display screen 10 can also be bent, at the same time, the support 20 is configured to support the flexible display screen 10, and the support 20 is provided with a hollowed-out structure in a region corresponding to the second bending region 12, so that while the flexible display panel has a folding function, a curved structure with a specific curvature can be formed at the edge of the flexible display panel. Therefore, the flexible display screen can be used to form a foldable flexible display device with a curved surface. When the consumer holds the flexible display device, a palm of a hand touches the curved surface of the edge of the flexible display screen, which can improve a handfeel of consumers, and at the same time facilitate consumers to slide and operate the flexible display screen.

In the above-mentioned embodiments, the description of each embodiment has its own emphasis. For parts that are not described in detail in an embodiment, reference can be made to related descriptions of other embodiments.

Specific embodiments are used in the present article to illustrate the principles and implementation of the application. The descriptions of the above embodiments are only used to help understand the technical solutions and core ideas of the application. A person skilled in the art can make various modifications and changes to the above embodiments without departing from the technical idea of the present invention, and such variations and modifications are intended to be within the scope of the invention.

What is claimed is:

1. A flexible display device, comprising a middle frame module and a flexible display panel, wherein the flexible display panel comprises:
   a flexible display screen comprising a first bending region and a second bending region positioned on two opposite sides of the first bending region, wherein the second bending region is positioned at an edge of the flexible display screen; and
   a support disposed on a backside of the flexible display screen and connected to the flexible display screen, wherein the support comprises a first folding portion corresponding to the first bending region and a hollowed-out structure corresponding to the second bending region;
   wherein the middle frame module is positioned on a backside of the flexible display panel and is connected to the flexible display panel, the middle frame module comprises a folding region corresponding to the first bending region, a portion of the flexible display screen positioned in the second bending region is bent to the backside of the flexible display screen to form a first curved portion, the first curved portion comprises a first horizontal plane that faces towards the middle frame module and is at an end edge of the first curved portion, the middle frame module further comprises a second curved portion corresponding to the first curved portion, a curved surface of the second curved portion is matched with a curved surface of the first curved portion, and the second curved portion comprises a second horizontal plane that is at an end edge of the second curved portion and attached to the first horizontal plane.

2. The flexible display device according to claim 1, wherein a first grid-structure is provided at the first folding portion.

3. The flexible display device according to claim 2, wherein the hollowed-out structure comprises a second folding portion corresponding to the second bending region and a second grid-structure provided at the second folding portion, and the second folding portion is positioned at an edge of the support.

4. The flexible display device according to claim 3, wherein the second grid-structure extends to an edge of the second folding portion in a direction away from the first folding portion.

5. The flexible display device according to claim 3, wherein a distance between the edge of the second folding portion away from the first folding portion and the second grid-structure is greater than zero.

6. The flexible display device according to claim 3, wherein a grid density of the second grid-structure is less than a grid density of the first grid-structure.

7. The flexible display device according to claim 3, wherein the support comprises a first surface close to the flexible display screen and a second surface away from the flexible display screen, and a first grid-hole of the first grid-structure and a second grid-hole of the second grid-structure both connect the first surface to the second surface.

8. The flexible display device according to claim 7, wherein the first grid-hole and the second grid-hole are filled with a buffer material.

9. The flexible display device according to claim 1, wherein a bending axis of the first bending region is parallel to a bending axis of the second bending region.

* * * * *